United States Patent
Al et al.

(10) Patent No.: US 10,535,716 B2
(45) Date of Patent: Jan. 14, 2020

(54) ORGANIC ELECTROLUMINESCENT DISPLAY BACKPANEL, COVER AND DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Yu Al, Beijing (CN); Xuewu Xie, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/736,707

(22) PCT Filed: Apr. 1, 2017

(86) PCT No.: PCT/CN2017/079321
§ 371 (c)(1),
(2) Date: Dec. 14, 2017

(87) PCT Pub. No.: WO2017/202145
PCT Pub. Date: Nov. 30, 2017

(65) Prior Publication Data
US 2018/0158874 A1    Jun. 7, 2018

(30) Foreign Application Priority Data
May 27, 2016  (CN) .................... 2016 2 0526575 U

(51) Int. Cl.
*H01L 29/08*        (2006.01)
*H01L 27/32*        (2006.01)
(Continued)

(52) U.S. Cl.
CPC .......... *H01L 27/32* (2013.01); *H01L 51/5203* (2013.01); *H01L 51/5246* (2013.01);
(Continued)

(58) Field of Classification Search
CPC . H01L 27/32; H01L 27/3244; H01L 27/3281; H01L 51/5203; H01L 51/5246
See application file for complete search history.

(56) References Cited

U.S. PATENT DOCUMENTS

2001/0017372 A1* 8/2001 Koyama ........... G02F 1/136286
                                                          257/72
2005/0099123 A1   5/2005 Chen et al.
(Continued)

FOREIGN PATENT DOCUMENTS

CN        101740608 A      6/2010
CN        104466031 A      3/2015
(Continued)

OTHER PUBLICATIONS

International Search Report and Written Opinion for PCT App. No. PCT/CN2017/079321 dated Jul. 7, 2017(with English translation, 17 pages).

*Primary Examiner* — Phuc T Dang
(74) *Attorney, Agent, or Firm* — Foley & Lardner LLP; James F. Ewing; Paul M. H. Pua

(57) ABSTRACT

The present disclosure provides an organic electroluminescent display backpanel, cover and device, wherein the backpanel comprises a backpanel body and a plurality of supporting columns, the backpanel body comprises a substrate and an array of organic electroluminescent elements formed on the substrate, and the supporting column is disposed at a side of the array of organic electroluminescent elements away from the substrate.

11 Claims, 1 Drawing Sheet

(51) Int. Cl.
    *H01L 51/52*      (2006.01)
    *H05B 33/04*      (2006.01)
(52) U.S. Cl.
    CPC ...... *H01L 51/5256* (2013.01); *H01L 51/5259* (2013.01); *H05B 33/04* (2013.01); *H01L 2251/566* (2013.01)

(56) References Cited

U.S. PATENT DOCUMENTS

2015/0162386 A1* 6/2015 Furuie .................. H01L 51/525
                                                        257/40
2016/0049443 A1* 2/2016 Kim .................... H01L 51/0023
                                                        257/91
2016/0365537 A1* 12/2016 Qian ................... H01L 51/5253
2018/0059499 A1* 3/2018 Klement ............. G09G 3/3413

FOREIGN PATENT DOCUMENTS

| CN | 104517992 A  | 4/2015  |
|----|--------------|---------|
| CN | 205645819 U  | 10/2016 |

* cited by examiner

ORGANIC ELECTROLUMINESCENT DISPLAY BACKPANEL, COVER AND DEVICE

CROSS REFERENCE TO RELATED APPLICATIONS

This application is a U.S. National Stage under 35 U.S.C. § 371 of International Application No. PCT/CN2017/079321, filed on Apr. 1, 2017, which claims priority to and the benefit of Chinese patent application No. 201620526575.1 filed on May 27, 2016 and entitled "ORGANIC ELECTROLUMINESCENT DISPLAY BACKPANEL, COVER AND DEVICE", the disclosure of which is hereby incorporated by reference in its entirety.

FIELD OF THE INVENTION

The present disclosure relates to the technical field of display, and particularly to an organic electroluminescent display backpanel, cover and device.

BACKGROUND

The current organic light emitting diode (OLED) display device is a device for graphical display by use of a reversible discoloration phenomenon produced by an organic semiconductor material driven by current. OLED display device has advantages such as ultralight, ultrathin, high brightness, large view angle, low voltage, low power consumption, fast response, high definition, antiknock, flexibility, low cost, simple process, less use of raw materials, high luminous efficiency and wide temperature range, and is considered as the most promising next-generation display technology.

OLED device generally includes a cathode, an anode and an organic light-emitting layer sandwiched between the cathode and the anode. Under the externally applied voltage, electrons are injected from the cathode into the organic light-emitting layer and holes are injected from the anode into organic light-emitting layer, and in organic light-emitting layer, the electrons and the holes meet and recombine to produce excitons, i.e., radiating light. In a process of manufacturing OLED devices, especially large size OLED devices, the organic light-emitting layer may be mixed with foreign matters, and due to the small distance between the cathode and the anode, say about 0.3 µm, in the vacuum lamination process, the foreign matters are likely to pierce the membrane of the cathode or the anode under high pressure, which causes a short circuit between the cathode and the anode. Therefore, the whole pixel cannot be lit, dark spot occurs, and the display quality is severely affected.

At present, it is comparatively difficult to limit the size of the foreign matters to below 0.3 µm by means of in-process quality control, so it is hard to reduce dark spots produced by the foreign matters.

SUMMARY OF THE INVENTION

The present disclosure provides an organic electroluminescent display backpanel, cover and display device.

According to a first aspect, the present disclosure provides an organic electroluminescent display backpanel comprises a backpanel body and a plurality of supporting columns, the backpanel body comprising a substrate and an array of organic electroluminescent elements formed on the substrate and the supporting column is disposed at a side of the array of organic electroluminescent elements away from the substrate.

Alternatively, each of the supporting columns is located in an interval region between adjacent pixels.

Alternatively, the backpanel further comprises a buffer layer disposed between the array of organic electroluminescent elements and the supporting columns.

Alternatively, a material of the buffer layer comprises a water-absorbing material.

Alternatively, the backpanel further comprises a fill layer disposed between the buffer layer and the supporting columns.

Alternatively, the supporting columns adjoin the fill layer, and a hardness of the supporting columns is higher than that of the fill layer.

Alternatively, a material of the fill layer comprises a water-absorbing material.

Alternatively, the material of the supporting columns is the same with the material of the fill layer.

According to a second aspect, the present disclosure provides an organic electroluminescent display cover comprising a cover body and a plurality of supporting columns disposed at a first side of the cover body, wherein the first side is a side of the cover body that faces a backpanel adapted to the cover.

Alternatively, each of the supporting columns is in an interval region between adjacent pixels.

Alternatively, a material of the supporting columns comprises a water-absorbing material.

According to a third aspect, the present disclosure provides an organic electroluminescent display device comprising any of the aforementioned backpanel or any of the aforementioned cover.

BRIEF DESCRIPTION OF THE DRAWINGS

Feature information and advantages of the present disclosure will be understood more clearly by referring to the accompanying drawings, and the accompanying drawings are illustrative and should not be construed as any limitation to the present disclosure. In the drawings.

NOTES OF THE REFERENCE SIGNS

100—organic electroluminescent display backpanel in the prior art; 100'—organic electroluminescent display backpanel in the present disclosure; 101—substrate, 102—array of organic electroluminescent elements; 1021—first electrode layer; 1022—organic light emitting layer; 1023—second electrode layer; 103—buffer layer, 104—fill layer, 105a, 105b, 105—supporting columns in the backpanel; 106—foreign matters; 200—organic electroluminescent display cover in the prior art; 200'—organic electroluminescent display cover in the present disclosure; 201—cover body; 202—supporting columns in the cover.

DETAILED DESCRIPTION OF THE EMBODIMENTS

In order to understand the above objectives, features and advantages of the present disclosure more clearly, the present disclosure will be further described in detail below in combination with the drawings and the embodiments. It should be noted that, the embodiments of the present application and the features in the embodiments can be combined with each other without conflict.

Unless otherwise defined, the technical terms or scientific terms used herein should have normal meanings as understood by those skilled in the art. The words "first", "second", or the like used in the description and claims of the patent application in the present disclosure do not represent any order, number or importance, but are merely used to distinguish between different composite parts. Likewise, the word "one", or "a", or the like does not represent a restriction to number, but the existence of at least one. The word "connect" or "connected" or the like is not limited to a physical or mechanical connection, but can comprise an electrical connection, either directly or indirectly. "Up", "down", "left", "right" and the like are used to only represent relative position relations, and after an absolute position of the described object changes, the relative position relations change accordingly.

Unless otherwise explicitly specified in the context, a word used in the description and the claims, though in a singular form, includes its plural form, and vice versa. Thus, when mentioning a singular form of a term, usually a plural form of the corresponding term is included. Similarly, the words "include" and "comprise" are interpreted as inclusive but not exclusive. Likewise, the terms "comprise" and "or" should be interpreted as inclusive, unless such interpretations are explicitly prohibited in this document. For the term "instance" used in this document, especially following a set of terms, the "instance" is merely exemplary and illustrative, and should not be considered exclusive or extensive.

Many concrete details are described below for sufficient understanding of the present disclosure, but the present disclosure can be implemented in other ways than those described herein, so the scope of protection of the present disclosure is not restricted by the embodiments disclosed below.

Figure 1:
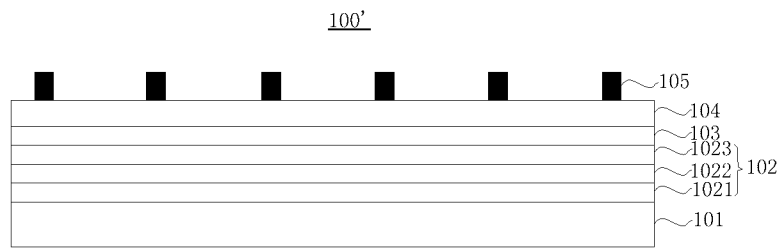
FIG. 1 shows a sectional view of an organic electroluminescent display backpanel according to an embodiment of the present disclosure.

According to a first aspect, one embodiment of the present disclosure provides an organic electroluminescent display backpanel 100', as shown in FIG. 1, comprising a backpanel body and a plurality of supporting columns 105, wherein the backpanel body comprises a substrate 101 and an array of organic electroluminescent elements 102 formed on the substrate 101; the supporting column 105 is disposed at a side of the array of organic electroluminescent elements 102 away from the substrate 101; the backpanel 100' further comprises a buffer layer 103 disposed between the array of organic electroluminescent elements 102 and the supporting columns 105; the backpanel 100' further comprises a fill layer 104 disposed between the buffer layer 103 and the supporting columns 105; the supporting columns 105 adjoins the fill layer 104, and the hardness of the supporting columns 105 is higher than that of the fill layer 104.

In the organic electroluminescent display backpanel 100' provided in the present embodiment, due to the provision of a plurality of supporting columns 105, in the time of vacuum lamination, pressures mainly act on the supporting columns 105. That is to way, the array of organic electroluminescent elements 102 receives greater pressures at the positions corresponding to the locations of the supporting columns 105, but the array of organic electroluminescent elements 102 receives smaller pressures corresponding to the locations where the supporting columns 105 are not provided. In this way, foreign matters in the array of organic electroluminescent elements 102 corresponding to the locations where the supporting columns are not provided are less likely to pierce the membrane in the array of organic electroluminescent elements, thereby achieving the basic objective of reducing dark spots.

Figure 2:
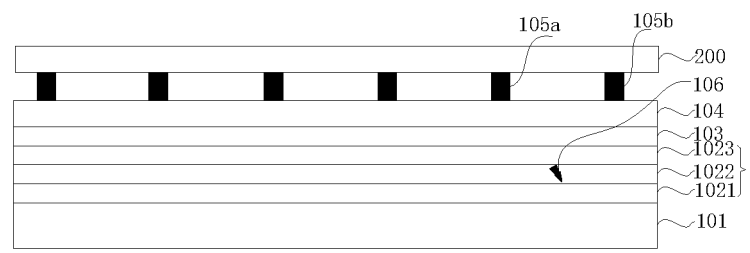
FIG. 2 shows a sectional view of an organic electroluminescent display device according to an embodiment of the present disclosure.

For instance, as shown in FIG. 2, when the backpanel 100' provided by the present embodiment is fitted to the cover 200 after the vacuum lamination is provided, the array of organic electroluminescent elements 102 at the positions corresponding to the supporting columns 105a and 105b receive greater pressures, and the array of organic electroluminescent elements 102 at the positions corresponding to an interval between the supporting columns 105a and 105b receives smaller pressures. Therefore, foreign matters 106 in the array of organic electroluminescent elements 102 corresponding to the interval between the supporting column 105a and 105b will have a smaller pressure too, thereby reducing the likelihood to pierce the membrane in the array of organic electroluminescent elements, so as to reduce dark spots.

In the present embodiment, since a buffer layer 103 is provided between the array of organic electroluminescent elements 102 and the supporting columns 105, during the vacuum lamination, the buffer layer 103 will give a certain buffer against a tremendous pressure applied to the backpanel 100', thereby preventing the foreign matters in the array of organic electroluminescent elements 102 from piercing the membrane due to a sudden tremendous pressure, which can further reduce dark spots. Furthermore, the buffer layer 103 can be made of a water-absorbing material, to avoid the outside moisture from entering the array of organic electroluminescent elements 102 of the backpanel 100', thereby extending the lifecycle of the backpanel 100'. Of course, in some alternative embodiments, it is not necessarily to provide a buffer layer 103 between the array of organic electroluminescent elements 102 and the supporting columns 105. Even if the buffer layer 103 is provided, it is not necessarily to manufacture the buffer layer 103 with water-absorbing material. Such a technical solution can also reach the basic objective of reducing dark spots, and thus falls into the scope of protection of the present disclosure.

In the present embodiment, since a fill layer 104 is provided between the buffer layer 103 and the supporting columns 105, and the supporting columns 105 adjoin the fill layer 104, an outside influence to the array of organic electroluminescent elements 102 can be reduced, thereby extending the lifecycle of the backpanel 100'. In practice, during the fabrications, the fill layer 104 can be made of a water-absorbing material, to absorb outside moisture. Of course, in some alternative embodiments, it is not necessarily provided a fill layer 104, and even if the fill layer 104 is provided, it is not necessarily to manufacture the fill layer 104 with water-absorbing material. Such a technical solution can also reach the basic objective of reducing dark spots, and thus falls into the scope of protection of the present disclosure.

In the present embodiment, in order to guarantee the support function of the supporting columns 105, the hardness of the supporting columns 105 is necessarily higher than that of the fill layer 104. In practice, during the fabrications, the supporting columns 105 can be made of a water-absorbing material, and in case where the fill layer 104 is also made of a water-absorbing material, the material of the supporting columns 105 may be selected to be the same with that of the fill layer 104, but it has a fluidity weaker than that of the fill layer 104 and a curing rate faster than the fill layer 104 while being irradiated with ultraviolet light, to make sure that the supporting column 105 has a sufficient hardness for achieving the supporting function. Of course, the supporting columns 105 can also choose a material with a good elasticity and adhesion such as polystyrene resin.

In the present embodiment, the concrete structure of the array of organic electroluminescent elements 102 is not limited and can be set as needed in specific implementations. As shown in FIG. 1, an alternative structure includes a first electrode layer 1021, an organic light emitting layer 1022, and a second electrode layer 1023 provided on the substrate 101 in this order. The organic light emitting layer 1022 can be equivalent to a light emitting diode, and when a voltage between the first electrode layer 1021 and the second electrode layer 1023 is greater than a turn-on voltage of the light emitting diode, the organic light emitting layer 1022 would emit light. In practice, during the fabrications, the first electrode layer 1021 may be set as the cathode and the second electrode layer 1023 may be set as the anode, or the first electrode layer 1021 may be set as the anode and the second electrode layer 1023 may be set as the cathode. Among them, the electrode layer as the cathode can be formed with metal through the evaporation process, and the electrode layer as the anode can be formed with a transparent conductive material such as ITO through the evaporation process. In case where the first electrode layer 1021 is the cathode and the second electrode layer 1023 is the anode, the light exiting direction of the array of organic electroluminescent elements 102 is away from the substrate 101. Since the supporting columns 105 are provided in the light exiting direction, in order to avoid an influence by the supporting columns 105 to the normal display of the backpanel 100', each supporting column 105 is provided in interval regions between adjacent pixels. In order to facilitate the fabrication of the supporting columns 105, each supporting column 105 may be uniformly arranged in the interval regions between adjacent pixels. Of course, in case where the first electrode layer 1021 is the anode and the second electrode layer 1023 is the cathode, the light exiting direction of the array of organic electroluminescent elements 102 is towards the substrate 101, and in this case, regardless of whether the supporting columns 105 are arranged in the interval regions between adjacent pixels, the normal display of the backpanel 100' will not be affected.

Figure 3:
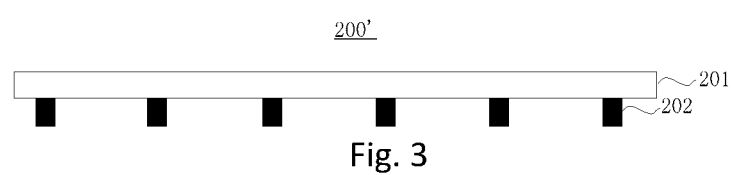
FIG. 3 shows a sectional view of an organic electroluminescent display cover according to an embodiment of the present disclosure.
Figure 4:
FIG. 4 shows a sectional view of an organic electroluminescent display device according to an embodiment of the present disclosure.

According to a second aspect, an embodiment of the present disclosure provides an organic electroluminescent display cover 200', as shown in FIGS. 3, 4, comprising a cover body 201 and a plurality of supporting columns 202 disposed at a first side of the cover body 201, wherein the first side is a side of the cover body 201 that faces a backpanel 100 adapted to the cover 200'.

In the organic electroluminescent display cover 200' provided in the present embodiment, due to the provision of a plurality of supporting columns 202 at the first side of the cover body 201, when the cover 200' is fitted to the backpanel 100 after the vacuum lamination is performed, pressures mainly act on the supporting columns 202. That is to way, the backpanel 100 receives greater pressures at the positions corresponding to the locations of the supporting columns 202, but backpanel 100 receives smaller pressures at the positions corresponding to the locations where the supporting columns 202 are not provided. In this way, foreign matters in the backpanel 100 at the positions corresponding to the locations where the supporting columns 202 are not provided are less likely to pierce the membrane, thereby achieving the basic objective of reducing dark spots.

In the present embodiment, the supporting columns 202 can be made of a water-absorbing material, to absorb outside moisture, thereby extending the lifecycle of the backpanel 100 fitted to the cover 200'. Of course, in some alternative embodiments, it is not necessarily to manufacture the supporting column 202 with water-absorbing material. Such a technical solution can also reach the basic objective of reducing dark spots, and thus falls into the scope of protection of the present disclosure.

In the present embodiment, the light exiting direction of the backpanel 100 might be towards the cover 200', so in order to avoid the supporting columns 202 provided on the cover 200' from shielding the lights emitted from the backpanel 100, each supporting column 202 is provided in interval regions between adjacent pixels. Moreover, in order to facilitate the fabrication of the supporting columns 202, each supporting column 202 may be uniformly arranged in the interval regions between adjacent pixels.

According to a third aspect, one embodiment of the present disclosure provides an organic electroluminescent display device comprising the backpanel 100' according to the first aspect or the cover 200' according to the second aspect.

In specific implementations, the organic electroluminescent display device in the present embodiment may further comprise a cover adapted to the backpanel. The formed display device can be specifically applied to: display panels, e-paper, mobile phones, tablets, televisions, monitors, notebook computers, digital frames, navigators, or any product or member having a display function.

The experiments proved that, as compared with the organic electroluminescent display device in the prior art, in the organic electroluminescent display device according to the present embodiment, dark spots can be reduced by about 75%, that is, the display quality is greatly improved.

Although the embodiments of the present disclosure have been described above in combination with the drawings, those skilled in the art could make various modifications and variations without departing from the spirit and scope of the present disclosure, and such modifications and variations all fall into the scope as defined by the accompanying claims.

The invention claimed is:

1. An organic electroluminescent display backpanel comprising a backpanel body and a plurality of supporting columns,
   wherein the backpanel body comprises a substrate and an array of organic electroluminescent elements formed on the substrate; and
   the plurality of supporting columns is disposed at a side of the array of organic electroluminescent elements away from the substrate,
   the backpanel further comprising a buffer layer disposed between the array of organic electroluminescent elements and the supporting columns and
   a fill layer disposed between the buffer layer and the supporting columns.

2. The backpanel according to claim 1, wherein the supporting columns are located in interval regions between adjacent pixels.

3. The backpanel according to claim 1, wherein a material of the buffer layer comprises a water-absorbing material.

4. The backpanel according to claim 1, wherein the supporting columns adjoin the fill layer, and a hardness of the supporting columns is higher than that of the fill layer.

5. The backpanel according to claim 1, wherein a material of the fill layer comprises a water-absorbing material.

6. The backpanel according to claim 5, wherein a material of the supporting columns is the same as the material of the fill layer.

7. The backpanel according to claim 1, wherein a material of the supporting columns is the same as a material of the fill layer.

8. An organic electroluminescent display device comprising an organic electroluminescent display backpanel, the backpanel comprising a backpanel body and a plurality of supporting columns, wherein the backpanel body comprises a substrate and an array of organic electroluminescent elements formed on the substrate; and the plurality of supporting columns is disposed at a side of the array of organic electroluminescent elements away from the substrate, the backpanel further comprising a buffer layer disposed between the array of organic electroluminescent elements and the supporting columns and a fill layer disposed between the buffer layer and the supporting columns.

9. The organic electroluminescent display device according to claim 8, wherein the supporting columns are located in interval regions between adjacent pixels.

10. The organic electroluminescent display device according to claim 8, wherein a material of the buffer layer comprises a water-absorbing material.

11. The organic electroluminescent display device according to claim 8, wherein the supporting columns adjoin the fill layer, and a hardness of the supporting columns is higher than that of the fill layer.

* * * * *